United States Patent
Crick

(10) Patent No.: US 6,184,717 B1
(45) Date of Patent: Feb. 6, 2001

(54) DIGITAL SIGNAL TRANSMITTER AND RECEIVER USING SOURCE BASED REFERENCE LOGIC LEVELS

(75) Inventor: William R. Crick, Nepean (CA)

(73) Assignee: Nortel Networks Limited, Montreal (CA)

( * ) Notice: Under 35 U.S.C. 154(b), the term of this patent shall be extended for 0 days.

(21) Appl. No.: 09/207,255

(22) Filed: Dec. 9, 1998

(51) Int. Cl.[7] ...................... H03K 17/16; H03K 19/0175
(52) U.S. Cl. .................. 326/86; 326/86; 326/30; 326/21; 326/22; 326/26; 326/90; 326/82
(58) Field of Search .................. 326/21, 22, 30, 326/26, 82, 86, 90

(56) References Cited

U.S. PATENT DOCUMENTS

| | | | |
|---|---|---|---|
| 5,023,488 | 6/1991 | Gunning | 307/475 |
| 5,341,046 | 8/1994 | Crafts | 307/475 |
| 5,347,177 | 9/1994 | Lipp | 307/443 |
| 5,355,391 | 10/1994 | Horowitz et al. | 375/36 |
| 5,397,940 | 3/1995 | Janssen | 326/83 |
| 5,481,207 | 1/1996 | Crafts | 326/86 |
| 5,550,496 | 8/1996 | Desroches | 327/108 |
| 5,563,542 | 10/1996 | Waterai | 327/382 |
| 5,604,450 | 2/1997 | Borkar et al. | 326/82 |
| 5,680,062 | 10/1997 | Lee et al. | 326/63 |
| 5,811,984 * | 9/1998 | Long et al. | 326/30 |
| 5,850,154 | 12/1998 | Higuchi | 326/86 |
| 5,864,584 * | 1/1999 | Cao et al. | 375/244 |
| 5,936,429 * | 8/1999 | Tomita | 326/82 |
| 5,994,919 * | 11/1999 | Jain | 326/30 |

FOREIGN PATENT DOCUMENTS

| | | | |
|---|---|---|---|
| 0 635 954 | 1/1995 | (EP) | H04L/5/14 |
| 0 823 786 | 11/1998 | (EP) | H03K/19/0175 |
| 09 081289 | 3/1997 | (JP) | G06F/3/00 |

OTHER PUBLICATIONS

European Search Report for EP 99 30 9742, Mar. 14, 2000, p. 1–2.
Patent Abstracts of Japan, Pub. No. 09081289, vol. 1997, No. 07, Jul. 31, 1997.

* cited by examiner

*Primary Examiner*—Michael Tokar
*Assistant Examiner*—Vibol Tan

(57) ABSTRACT

A signal transmitter for transmitting digital logic signals and a complementary receiver, are disclosed. The signal transmitter comprises a plurality of signal drivers and at least one reference driver. The signal drivers transmit digital signals, while the reference driver transmits a constant signal representative of a digital HI or LO. The signal and reference drivers are interconnected so that any noise due to package and power supply interconnection impedances is present in all transmitted signals including any reference signals. At a receiver, the reference signal including noise is used to establish threshold levels for digital HI and LO signals. Because noise is common to all transmitted signals, the receiver is able to reduce the effects of the noise by comparing the plurality of received signals with the reference signal.

32 Claims, 5 Drawing Sheets

US 6,184,717 B1

DIGITAL SIGNAL TRANSMITTER AND RECEIVER USING SOURCE BASED REFERENCE LOGIC LEVELS

FIELD OF THE INVENTION

The present invention relates to a signal transmitter for transmitting digital logic signals and a complementary receiver, and more particularly to a digital logic transmitter that generates one or more reference signals, to be used by the receiver to establish threshold levels for digital HI and LO signals.

BACKGROUND OF THE INVENTION

Digital electronic systems typically utilize very large scale integrated circuit ("VLSI") blocks. VLSI blocks, are interconnected to each other within an electronic system by electronic conductors that act as transmission lines. Digital HI and LO signals are represented by two distinct voltage levels presented on the conductors. A "driver" forming part of one VLSI block couples a transmitting VLSI block to the transmission lines. Similarly, a "receiver" forming part of a receiving VLSI block, couples the receiving VLSI block to the lines. Each driver and receiver typically comprises a plurality of transistors formed on the respective VLSI blocks.

The transistors forming the drivers and receivers are coupled to ground points on the VLSI blocks. These ground points, however, are not at the same potential as the external ground potential of the VLSI packages. Drivers are coupled to the external ground connection through a package impedance. This package impedance typically has resistive, inductive, and capacitive components and is therefore a source of electrical noise present when a driver output switches from LO to HI or HI to LO. This noise is typically referred to as a "ground bounce".

At the receiver, binary HI and LO signals are typically distinguished by their voltage levels relative to the receiver package ground. Signals that exceed a threshold voltage level represent a digital HI while signals that fall beneath another threshold voltage represent a digital LO. As will be appreciated, the presence of noise from the transitioning signal at the transmitter, may cause a signal not intended to cross a threshold to cross this threshold, as sensed at a receiver. This, in turn, may lead to errors in the received signal.

Numerous digital drivers and receivers address this problem. For example, the gunning transceiver logic ("GTL") family as more particularly described in U.S. Pat. No. 5,023,488 uses low voltage swings that reduce transient effects of parasitic impedances, including package impedances. As well, this patent discloses clamping the drain to source of a GTL driver to reduce the rate at which current is drawn so as to provide increased damping for noise due to transient voltages.

Still other logic families use differential outputs. As the effect of parasitic impedances is the same for both outputs of a differential pair, differential signals naturally reject common mode noise. Differential signals, however, require double the number of outputs for a transmitting VLSI block; double the number of transmission lines interconnecting the transmitting VLSI block to the receiving VLSI block; and double the number of inputs at the receiving VLSI block. As will be appreciated, it would often be desirable to eliminate these extra inputs, outputs and interconnects.

Accordingly, an alternative to known approaches to reduce the effects of package impedance in digital transmitters and receivers is desirable.

SUMMARY OF THE INVENTION

In accordance with the present invention a transmitter and complementary receiver use HI and/or LO reference signals generated at the transmitter, and transmitted to the receiver. The reference signals are used at the receiver to account for noise components in received signals that are representative of digital HI or LO signals.

In accordance with an aspect of the invention, there is provided a signal transmitter block formed as part of an integrated circuit. The transmitter block transmits digital signals to a receiver. The transmitter block includes several signal drivers, each for generating output voltages at a signal driver output, that when measured relative to a ground point on the integrated circuit are representative of digital HI and LO signals. A first reference driver, for generating at a first reference output an output voltage that when measured relative to the ground point, corresponds either a digital HI signal; or a digital LO signal, forms part of the block. The first reference driver and the signal drivers are electrically interconnected to the ground point on the integrated circuit block. The ground point is further interconnected through an impedance on the integrated circuit block to a system ground connection for the integrated circuit, so that current flowing from and to the system ground connection through the ground point to the signal drivers and the first reference driver flows through the impedance.

In accordance with another aspect of the invention, a digital signal receiver block having receiver block outputs for generating digital HI and LO signals, includes several comparators. Each comparator has a signal input for receiving a voltage signal representative of one of a digital HI signal and LO signal and a noise signal; an output interconnected with one of the receiver block outputs; and a first reference input for receiving a reference voltage signal including a signal indicative of a digital LO signal, and a noise signal. The first reference inputs of the several comparators are interconnected so that each of the reference inputs receives the same reference voltage signal. Each of the comparators is adapted to produce at its output a signal representative of a digital LO signal when a voltage at its signal input is less than a threshold voltage derived from a reference voltage at its first reference input.

In accordance with yet another aspect of the present invention, there is provided a method of transmitting and receiving several signals representative of digital HI and LO signals from a transmitter to a receiver. The method includes the steps of a. concurrently transmitting the several signals, each having a voltage level representative of one of a digital HI and LO signal and a noise signal from a transmitter to a receiver; b. transmitting a reference signal comprised of a signal having a voltage level representative of a HI signal and a noise signal to the receiver; c. receiving the several signals and the reference signal at the receiver; d. comparing the reference signal to each of the several signals; e. outputting a signal representative of a digital HI signal at the receiver, for each of the several signals that exceeds a threshold voltage derived from the reference signal.

Advantageously, the invention provides rejection of noise signals without the use of differential signals.

Other aspects and features of the present invention will become apparent to those of ordinary skill in the art upon review of the following description of specific embodiments of the invention in conjunction with the accompanying figures.

BRIEF DESCRIPTION OF THE DRAWING

In figures which illustrate, by way of example only, embodiments of the present invention.

DETAILED DESCRIPTION

Figure 1:
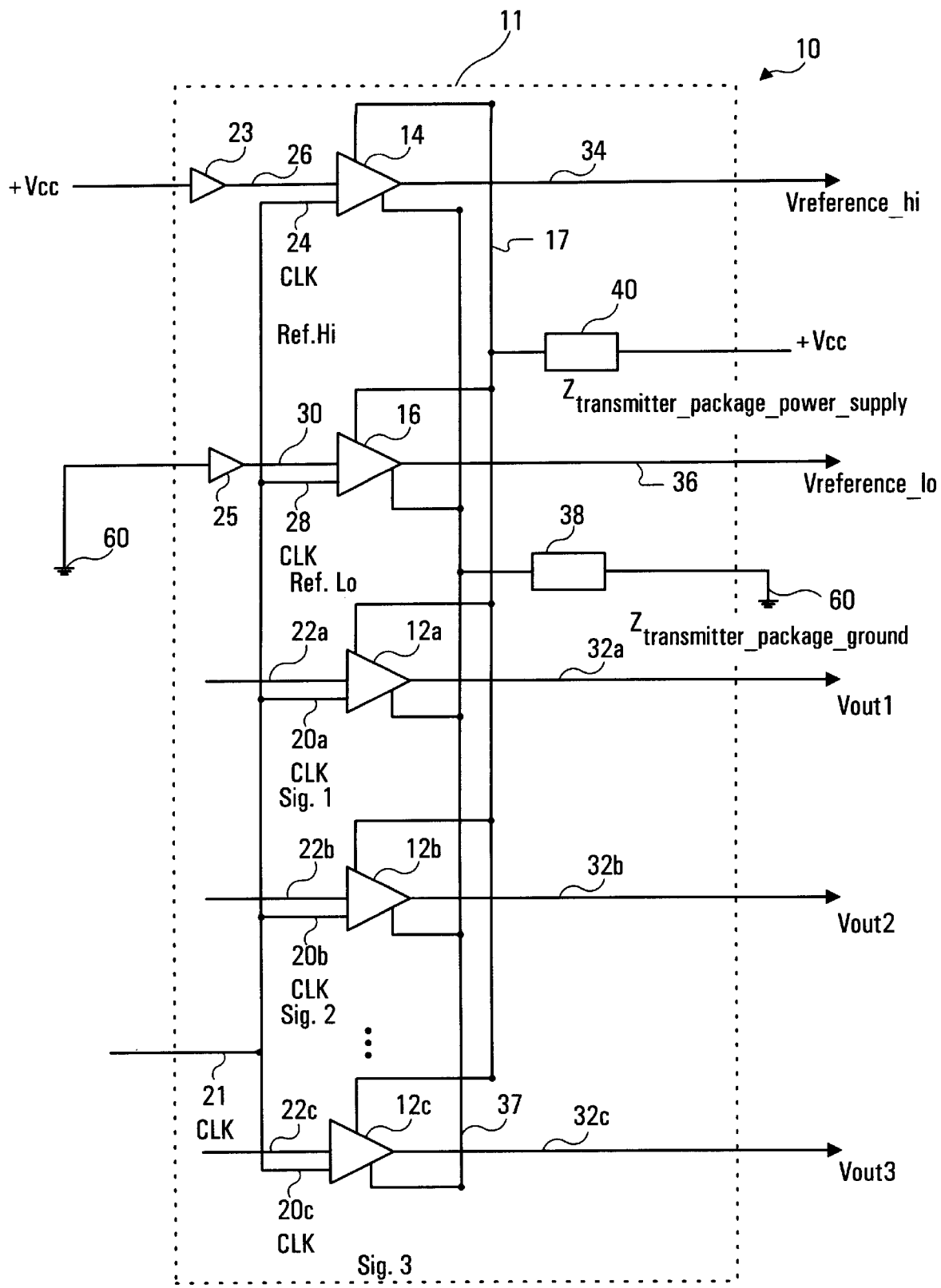
FIG. 1 is a schematic diagram of a digital transmitter block exemplary of an embodiment of the present invention.

FIG. 1 schematically illustrates a signal transmitter block 10, exemplary of a preferred embodiment of the present invention. Signal transmitter block 10 is formed as part of a VLSI block 11 in accordance with generally known VLSI design and fabrication techniques.

Transmitter block 10 comprises a plurality of digital signal drivers 12a to 12c (individually and collectively 12). For clarity, only three signal drivers are illustrated. A person skilled in the art will appreciate that a typical transmitter (usually comprises) more than three drivers. Each driver has a signal input 22 (22a to 22c for drivers 12a to 12c, respectively); a clock input 20 (20a to 20c for drivers 12a to 12c, respectively); and an output 32 (32a to 32c for drivers 12a to 12c, respectively). On the transition of a clock pulse at clock input 20, a driver presents at its output 32 voltage levels representative of digital HI and LO signals corresponding to an input signal presented at its signal input 22.

Transmitter block 10 further comprises a reference HI driver 14 and reference LO driver 16, having signal inputs 26 and 30, clock inputs 24 and 28, and outputs 34 and 36, respectively. Like signal drivers 12, reference drivers 14 and 16 present at their outputs 34 and 36 signals representative of their inputs 26 and 30 upon the transition of a clock signal at clock inputs 24 and 28.

Preferably, a common clock input 21, interconnects all clock inputs 20, 24 and 28 of drivers 12, 14 and 16.

All of the drivers 12, 14 and 16 are preferably formed of identical electric components and typically comprise one or more known transistor devices. Each driver may for example be a CMOS or bi-polar driver providing transistor to transistor (TTL) logic, positive emitter coupled logic (PECL), or other outputs. A person skilled in the art will appreciate that other drivers may be appropriately used. Reference drivers 14 and 16 are thus typical drivers, of the same type used as signal drivers 12.

As illustrated, each driver 12, 14, 16 is connected to a positive voltage source rail 17 interconnected through power supply interconnection impedance $Z_{transmitter\_package\_power\_supply}$ 40 to external power supply voltage $^+V_{cc}$. Further, each driver is connected to an on chip ground rail 37 (GND) formed as part of VLSI block 11. VLSI block 11 is further connected to an external system ground 60. Because of the package impedance of VLSI block 11 and system ground impedances unique to the transmitter ground current path, ground rail 37, the ground connection point for drivers 12, 14 and 16, is actually coupled to system ground 60 through an impedance that may be modelled by an impedance $Z_{transmitter\_package\_ground}$ 38. The combination of impedances $Z_{transmitter\_package\_power\_supply}$ 40 and $Z_{transmitter\_package\_ground}$ 38 represent the total package impedance of VLSI block 11. Power supply interconnection impedance $Z_{transmitter\_package\_power\_supply}$ 40 and ground impedance $Z_{transmitter\_package\_ground}$ 38 may be modelled as having resistive, capacitive and inductive components. As will be appreciated, it is possible that power supply interconnection impedance $Z_{transmitter\_package\_power\_supply}$ 40 and package impedance $Z_{transmitter\_package\_ground}$ 38 are non-linear.

Signal inputs 26 and 30 of reference drivers 14 and 16 are interconnected with gates 23 and 25, respectively. The input of gate 23 is connected to $^+V_{cc}$ causing the output of gate 23 to produce a voltage representative of a logic HI at input 26 of driver 14. Similarly, the input of gate 25 is connected to system ground 60 causing the output of gate 25 to produce a voltage representative of a logic LO signal at input 30 to driver 16. As will become apparent, outputs 34 and 36 of drivers 14 and 16 thus always generate HI and LO output signals, used as reference signals. Gates 23 and 25 need not be formed as part of transmitter block 10.

Signal inputs 22 to drivers 12 may be interconnected to n input signals, typically originating on VLSI block 11. These input signals may, for example, ultimately emanate from n address or data lines of an n bit computer bus. Typically, these n input signals are synchronous and clocked by their source. Common clock input 21 is thus typically interconnected to a system clock which may also be provided by the clock of a computer.

Figure 2:
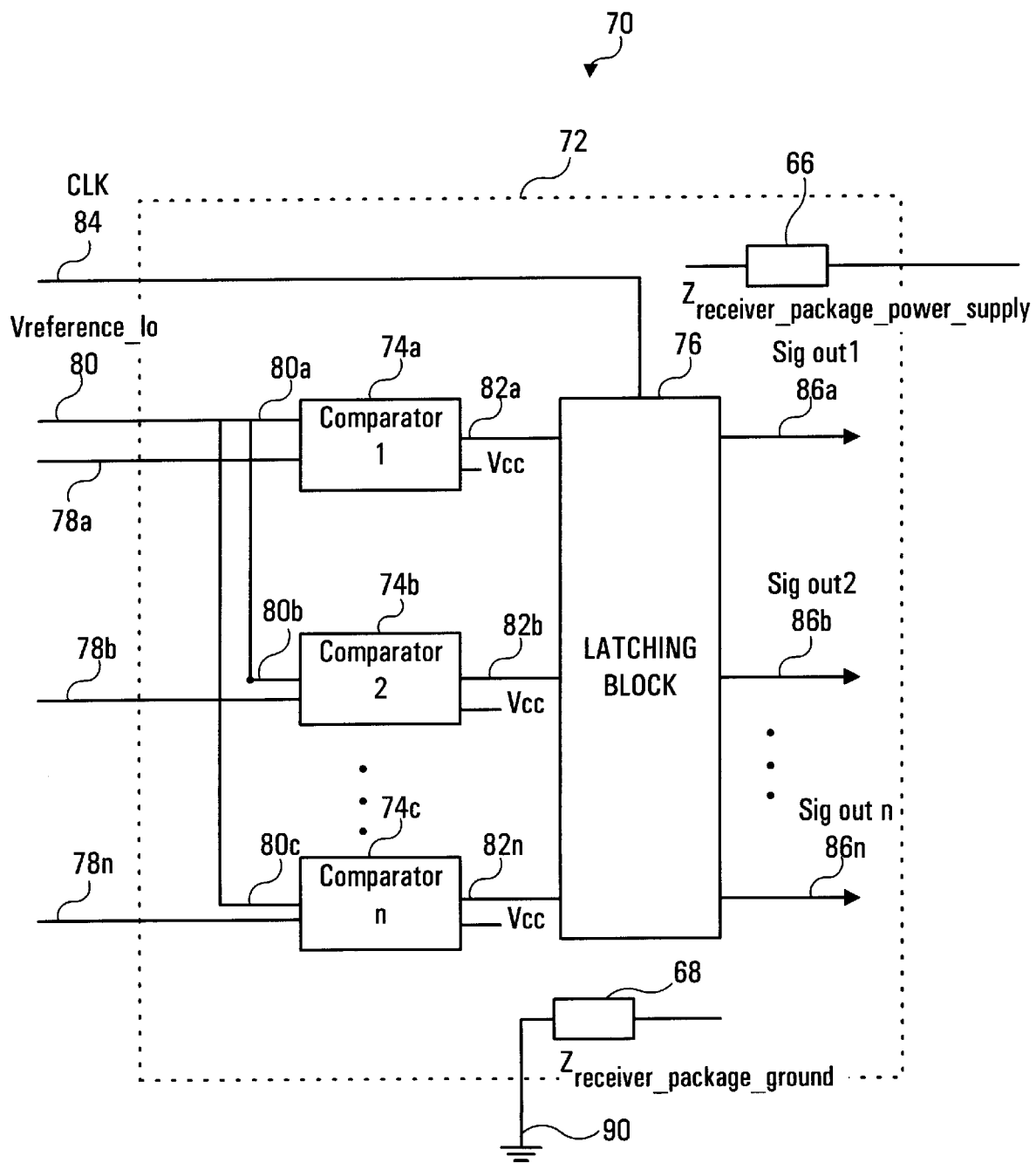
FIG. 2 is a schematic diagram of a receiver block exemplary of an embodiment of the present invention

FIG. 2 illustrates a receiver block generally marked 70 exemplary of a preferred embodiment of the present invention. In the preferred embodiment, receiver block 70 is formed as part of a VLSI block 72 that is physically distinct from VLSI block 11 (FIG. 1). VLSI block 72 is connected to system ground 90. Receiver block 70 comprises a plurality of comparators 74a to 74c (individually and collectively 74). For clarity, only three comparators 74a to 74c are illustrated. A person skilled in the art will appreciate that a typical receiver block comprises more than three such comparators and typically one comparator for each transmitter in a complementary transmitter block. Each comparator 74 takes at its input 80 (80a to 80c for comparators 74a to 74c, respectively) a reference signal and an input signal at input 78 (78a to 78c for comparators 74a to 74c, respectively). Outputs 82 (82a to 82c for comparators 74a to 74c, respectively) present a fixed output voltage if an associated input 78 is less than a trigger voltage derived from the reference signal at reference input 80. Typically, the trigger voltage equals the reference voltage plus a noise or hysteresis margin, $V_{margin}$. Comparators 74 may be designed to allow for adjustment to the hysteresis margin, in accordance with design techniques known to those skilled in the art.

As illustrated, each comparator 74 is connected to a positive voltage source $^+V_{cc}$, preferably interconnected with $^+V_{cc}$ of VLSI block 11. Package and power supply interconnect impedances of VLSI block 70 that might be modelled similar to $Z_{transmitter\_package\_ground}$ 38 and $Z_{transmitter\_package\_power\_supply}$ 40 of VLSI block 11 have been illustrated as $Z_{receiver\_package\_ground}$ 66 and $Z_{receiver\_power\_supply}$ 68.

Outputs 82 of comparators 74 are interconnected with latching block 76. Latching block 76 further takes as an input a clock signal presented at clock input 84. Latching block 76 latches at its outputs 86a to 86c (individually and collectively 86) logic input values 82a to 82c, respectively, upon sensing a transition of clock input 84. Latching block 76 may for example comprise a plurality of D-type flip-flops whose inputs are connected to comparator outputs 82a to 82c and whose outputs represent the latch outputs 86a to 86c. A person skilled in the art will appreciate a variety of latching circuits that could be used in place of the D-type flip flops. Typically, outputs 86 are interconnected with another functional circuit block (not shown) of VLSI block 72, that may process signals presented at outputs 86.

Figure 3:
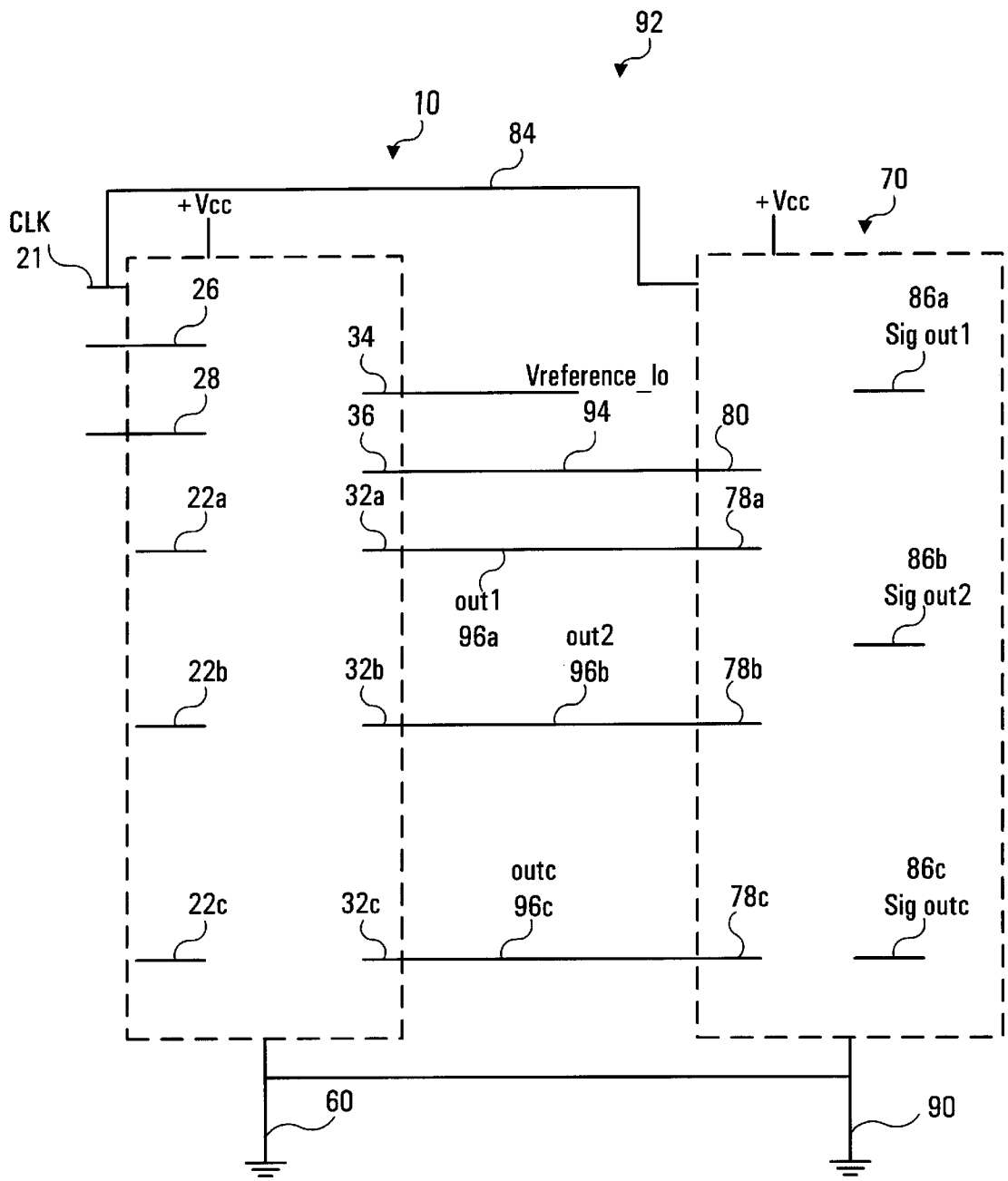
FIG. 3 is a schematic diagram of a signal transmitter and receiver system exemplary of an embodiment of the present invention.

FIG. 3 illustrates an exemplary interconnection of transmitter block 10 (FIG. 1) with receiver block 70 (FIG. 2) forming a digital transmitter and receiver system generally marked 92. As illustrated outputs 34 and 32a to 32c of transmitter block 10 are interconnected with transmission lines 94, and 96a to 96c, respectively. Ground 60 is interconnected with ground 90. These transmission lines are typically traces of a printed circuit board interconnecting VLSI blocks 11 and 72.

Inputs 78a to 78c of receiver block 70 are interconnected with the terminating ends of transmission lines 96a to 96c. Additionally, transmission line 94 interconnected with reference HI driver 14, is interconnected with reference input 80a (80 in FIG. 3) of receiver block 70. As well, a common clock source is interconnected with driver clock input 21 and receiver block clock input 84. Of course, clock input 84 could be driven by a signal otherwise derived and interrelated with a signal at clock input 21. For example, VLSI block 72 could comprise a phase locked loop, locked to a clock signal on VLSI block 11 used to clock receiver block 70. Alternatively, a clock signal may be recovered from a data stream at receiver block 70.

In system 92, reference HI driver 14 and its output 34 are not interconnected to receiver block 70. As will become apparent, reference drivers 14 and 16 provide voltage levels representative of digital reference HI and LO signals, respectively. Only one of reference drivers 14 or 16 is required. Thus, one of drivers 14 and 16 is optional and could be eliminated. In practise, if only a single reference driver is used, reference LO driver 14 is preferably used as "ground bounce" noise more significantly affects logic LO signals, than logic HI signals.

Figure 4:
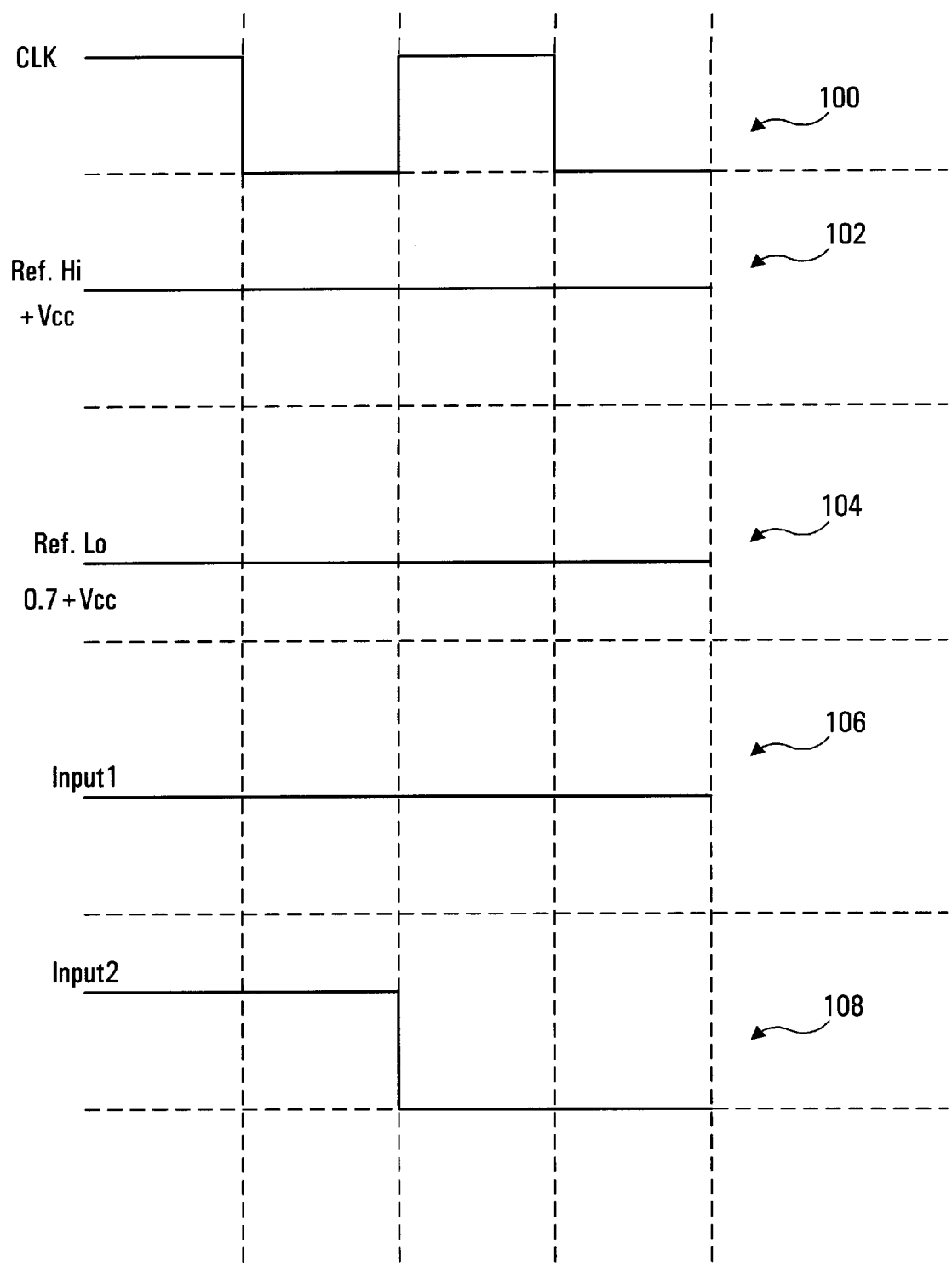
FIG. 4 illustrates a plurality of signal waveforms present in the system of FIG.3, in operation.
Figure 5:
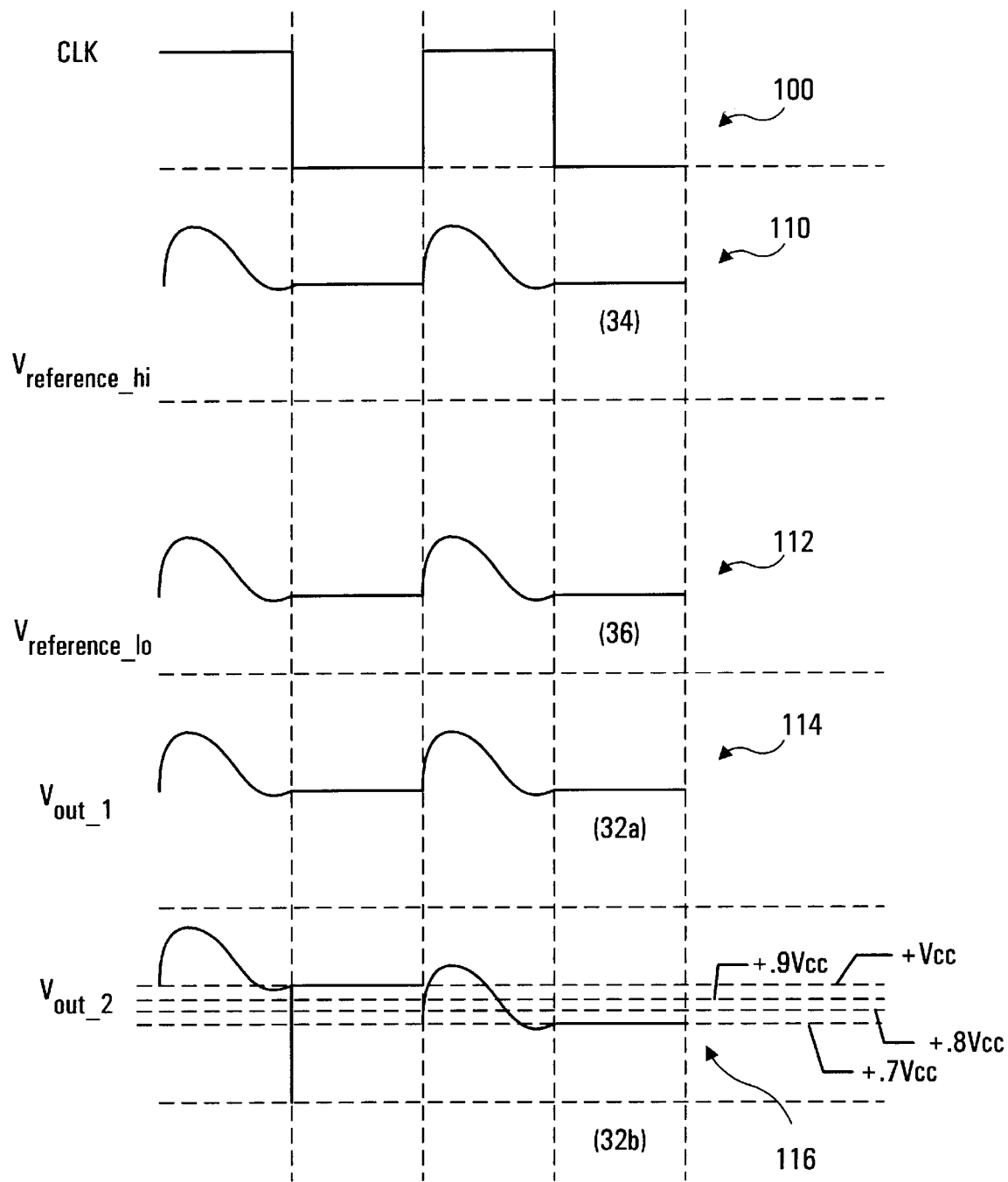
FIG. 5 illustrates a further plurality of signal waveforms, present in the system of FIG. 3, in operation.

FIGS. 4 and 5 illustrate various signals present in the system depicted in FIG. 3, in operation.

Specifically, FIG. 4 illustrates input signals present at transmitter block 10 for two complete clock cycles 100 at clock inputs 21 and 84 as shown in FIGS. 1–3.

In the operational example, voltage levels representing digital HI and LO signals are represented by positive voltage values $^+V_{cc}$ for binary HI signals and $0.7^+V_{cc}$ for binary LO signals, both measured relative to system ground 60. The receiver is designed to operate with a hysteresis or noise margin of $0.1+V_{cc}$. Accordingly, a binary HI signal is therefore generated for inputs greater than $0.9^+{}_{cc}$, while a binary LO signal is generated for inputs less than $0.8^+V_{cc}$. In other words, voltage signals exceeding $0.9^+V_{cc}$ are interpreted as digital HI signals, while voltage signals less than $0.8^+V_{cc}$ are interpreted as digital LO signals. Of course, depending on the precise drivers, transmitters and receivers exemplary of the present invention may use other voltage levels, such as for example, typical CMOS or TTL logic levels.

In the illustrated example, signals 106 and 108 are applied to signal inputs 22a and 22b, of drivers 12a and 12b of transmitter block 11 (FIGS. 1 and 3), respectively. As illustrated input signal 106 represents a binary HI in both clock cycles, while input signal 108 represents a binary HI signal in a first clock cycle, followed by a transition to a binary LO in a second clock cycle. For illustration, voltages representing logic HI and LO values at inputs 22 are chosen as $^+V_{cc}$ and $0.7^+V_{cc}$, respectively. Of course, logic voltage levels at inputs 22 need not be the related to output voltages or threshold voltages presented at inputs 26 and 30. Transmitter block 10 could easily be adapted to translate input logic levels to other output values. Signals 100, 102, 104 and 106 are measured relative to GND at rail 37, and are therefore free from noise due to the package impedance $Z_{transmitter\_package\_ground}$ 38 and $Z_{transmitter\_package\_power\_supply}$ 40 of VLSI block 11.

The outputs of transmitter block 10, at outputs 34, 36 and 32a and 32b (illustrated in FIG. 1) measured relative to system ground 60, in operation, are depicted in FIG. 5. As well, for convenience, clock signal 100 is again illustrated.

As illustrated, $V_{reference\_hi}$ and $V_{reference\_lo}$ deviate from the expected $^+V_{cc}$ and $^+.7V_{cc}$ because of the voltage drops across $Z_{transmitter\_package\_ground}$ 38 and $Z_{transmitter\_package\_power\_supply}$ 40.

Output reference signal $V_{reference\_hi}$ 110 measured relative to system ground 60 at output 34 of driver 14 exhibits slight ringing (not shown) at the commencement of each cycle of clock signal 100. This ringing is attributable to transient current through package impedance $Z_{transmitter\_package\_ground}$ 38 and $Z_{transmitter\_package\_power\_supply}$ 40, and the resulting voltage signals. As previously noted, $Z_{transmitter\_package\_ground}$ 38 and $Z_{transmitter\_package\_power\_supply}$ 40 may be modelled as comprising resistive, inductive and capacitive components. As illustrated, the duration of the ringing is typically only a fraction of the clock period. The duration and amplitude of the ringing is dependent on the values of $Z_{transmitter\_package\_ground}$ 38 and $Z_{transmitter\_package\_power\_supply}$ the amount and rate of current provided to drivers 12, 14 and 16.

More significantly, as illustrated, output reference signal $V_{reference\_hi}$ exhibits an upward voltage drift relative to system ground 60 at the commencement of each clock cycle. This upward drift is attributable largely to the $Z_{package\_power\_supply\_ground}$ 38 portion of the package impedance. Specifically, as reference hi driver 14 produces its output relative to chip ground 37, and $Z_{package\_power\_supply\_ground}$ 38 introduces a further voltage drop between chip ground 37 and system ground 60, that manifests itself in the illustrated upward drift or "ground bounce". As well, a voltage drop in the HI signals may be attributable to the voltage drop caused by current through $Z_{transmitter\_package\_power\_supply}$ 40. However, $V_{reference\_hi}$ is affected by a similar drop.

It is worth noting that effect of $V_{ground\ noise}$ is far more significant in sensing logic LO signals at the receiver. This is because the upward voltage drift caused by the voltage drop across $Z_{power\_supply\_ground}$ causes LO signals to drift above the threshold required by receiver 70 to detect a logic LO signal. This same drift will cause HI signals that already exceed the minimum voltage for a HI signal to merely further exceed this signal.

As such, in practise, if only a single reference driver is used, reference LO driver 14 is preferably used as "ground bounce" noise more signifcantly affects logic LO signals than logic HI signals.

A reference LO signal $V_{reference\_lo}$ 112 at output 36 measured relative to system ground 60 experiences similar drift and ringing as do driver output signals $V_{out1}$ 114 and $V_{out2}$ 116 at outputs 32a and 32b of drivers 12a and 12b. As will be appreciated, and as illustrated, neglecting any pin impedance, the ringing and drift in signals 110, 112, 114 and 116 attributable to package impedance $Z_{transmitter\_package\_ground}$ 38 will be substantially similar in all n drivers 12a to 12c as well as reference LO and HI drivers 14 and 16 as they are connected to system ground 60 through common package impedance $Z_{transmitter\_package\_ground}$ 38.

Similarly, the ringing and drift in signals 110, 112, 114 and 116 attributable to power supply interconnect impedance $Z_{transmitter\_package\_power\_supply}$ 40 will be identical, as current provided by an external power supply to all drivers 12a to 12c as well as reference LO and HI drivers 14 and 16 must flow through common power supply impedance $Z_{transmitter\_package\_power\_supply}$ 40.

More specifically, the instantaneous output voltage of each driver at outputs 32, 34 or 36 relative to system ground 60, may be modelled as:

$$V_{out\_n} = V_{driver\_n} + V_{noise},$$

where $V_{driver\_n}$ is the output of the nth driver at transmitter 10, measured relative to "chip" ground 37

Assuming that noise other than package ground and power supply interconnect noise is negligible, and further assuming that $V_{ground\_noise} \gg V_{power\_supply\_noise}$ $$V_{out\_n} = V_{driver\_n} + V_{ground\ noise}$$

$V_{ground\ noise}$, may further be modelled as $$V_{ground\ noise} = I_{ground\ package} * Z_{transmitter\_package\_ground},$$

with $$I_{ground\ package} = I_{ground\ driver\ total} = I_{ground\ driver\_1} + I_{ground\ driver\_2} + \ldots$$
$$+ I_{ground\ driver\_n}$$
$$+ I_{ground\ refdriver\_hi} + I_{ground\ refdriver\_lo}$$

Thus, the instantaneous contribution of $v_{noise}$ to each output signal $V_{out\_n}$ is identical for each driver output signal. Moreover, the contribution of vnoise depends on the total current drawn by transmitter block 10, and therefore will vary from clock cycle to clock cycle, depending on the number of drivers producing HI or LO outputs.

Assuming pin and transmission line effects are negligible, in FIG. 3. signals at outputs 32a, and 32b of transmitter block 10 are presented at receiver inputs 78a and 78b through lines 96a and 96b. Similarly, signal 112 of FIG. 4 at reference LO output 36 of transmitter block 10 is presented at reference LO input 80 interconnected with comparator reference inputs 80a and 80b of FIG. 2 of receiver 70 through line 94.

At the receiver, the effect of current drawn by the transmitter block 10 will have a negligible effect on receiver block 72. However, as illustrated, voltage levels received at the receiver block 72, measured relative to system ground 60 will fluctuate, often significantly, depending largely on the current drawn through $Z_{transmitter\_package\_ground}$ 38.

As will become apparent, use of comparators and reference signals $V_{reference\_hi}$ and $V_{reference\_lo}$ signals attempt to compensate for such fluctuations.

Specifically the output 82 of each comparator 74 in FIG. 2, varies depending on whether or not the voltage level of the input signal at input 78 exceeds the reference voltage presented at input 80 less a hysteresis margin. If it does, output 82 will assume a voltage value representative of a digital HI signal at its output and at the input latching block 76.

Voltages at comparator inputs 80 and 78 are measured relative to each other. Output 82 is only LO if $V_{comparator\_n} = V_{out} < V_{reference\_lo} + V_{margin}$. Because the comparator inputs are measured relative to each other, any common mode noise in the driver and reference signal will be ignored. This is best illustrated by considering signal $V_{reference\_lo}$ and $V_{out}$ relative to system ground 60.

Thus, $V_{reference\_lo} = V_{ref} + V_{noise}$, where $V_{ref}$ is the threshold voltage measured relative to chip ground rail 37 and $$V_{comparator\_n} = V_{out\_n} = V_{driver\_n} + V_{noise}.$$

As noted, this leads to a LO comparator output only when $$V_{comparator\_n} < V_{reference\_lo} + V_{margin}$$
$$V_{driver\_n} + V_{noise} < V_{ref} + V_{noise} + V_{margin}; \text{ or}$$
$$V_{driver\_n} < V_{ref} + V_{margin}.$$

This precisely defines the required threshold level required to generate a digital output LO signal. Thus, the parasitic effects of source package impedance $Z_{transmitter\_package\_ground}$ 38 and power supply interconnect impedance $Z_{transmitter\_package\_power\_supply}$ 40, are eliminated through the use of a reference signal provided by driver 16 of transmitter block 10 to a receiver block 70 comprising a plurality of comparators 74.

In FIG. 2, on the rising edge of clock signal 100 of FIG. 4, latching block 76 latches at its outputs 86 the outputs of comparators 74. These outputs are typically provided to another functional block (not illustrated) formed as part of VLSI block 72.

Provided that drivers 12, 14 and 16 are formed in geometric proximity to each other, the effect of the package impedance $Z_{transmitter\_package\_ground}$ 38 on each of the drivers should be very similar if not identical, as any current passing from drivers 12, 14 and 16 to system ground 60 will flow through impedance $Z_{transmitter\_package\_ground}$ 38. Preferably, the location of reference drivers 14 and 16 is chosen to be near the geometric centre of interrelated drivers in a block of drivers on a VLSI block. As the number of drivers increases, and their geometric proximity decreases, the effects of package impedance on signals produced by each of the drivers will vary. It may accordingly be desirable to limit the transmitter block size, and therefore provide a single reference hi driver for a small number of drivers (ie. four, eight or sixteen drivers). Other block sizes anywhere between zero and twenty five might be appropriate. A signal transmitter may thus comprise a number of transmitter blocks substantially identical to transmitter block 10, as illustrated.

Alternatively, or additionally, $V_{reference\_hi}$ at output 34 may be transmitted to receiver block 70 in addition to or instead of $V_{reference\_lo}$ at output 36. High threshold comparisons may then be made at the receiver when $$V_{out} > V_{reference\_hi} - V_{margin}$$

at receiver 70.

This second verification allows the receiver to detect critical errors. That is, when a detected signal neither exceeds $V_{reference\_hi} - V_{margin}$, nor is less than $V_{reference\_lo} + V_{margin}$ an indeterminate error could be detected. Such error could be detected by other hardware blocks or, alternatively, comparators 74 could be adapted to detect such errors. The detection of such errors could be used to signal a possible hardware fault requiring signal retransmission or other error handling, or diagnosis or repair.

As will be appreciated, use of source side reference signals allows dynamic comparison of transmitted signals to the reference signal, which provides particular benefit for high frequency signals, for which the effects of package and power supply impedances may be particularly pronounced.

As should now also be appreciated, as reference drivers 14 and 16 should be conventional drivers, identical to signal drivers 12 existing transmitter blocks may easily be adapted to provide the required reference outputs. Gates 23 and 25 may be external.

It should further be appreciated that reference drivers 14 and 16 could be adapted to produce output voltages different from voltage levels used by transmitters 12 to represent HI and LO signals. For example, drivers 14 and 16 could be adapted to produce generalized low and high threshold voltage levels used to detect HI and LO signals. Thus, the margin or hysteresis voltages used by a receiver could be set at the transmitter source.

Finally, it will be understood that the invention is not limited to the embodiments described herein which are merely illustrative of a preferred embodiment of carrying out the invention, and which are susceptible to modification of form, arrangement of parts, steps, details and order of operation. The invention, rather, is intended to encompass all such modifications within its spirit and scope, as defined by the claims.

What is claimed is:

1. A signal transmitter block formed as part of an integrated circuit, said transmitter block for transmitting digital signals to a receiver, said block comprising:

a plurality of signal drivers, each for generating output voltages at a signal driver output, that when measured relative to a ground point on said integrated circuit are representative of digital HI and LO signals;

a first reference driver, for generating at a first reference output, one of
   a. an output voltage that when measured relative to said ground point, corresponds to a voltage representative of a digital HI signal; and
   b. an output voltage that when measured relative to said ground point corresponds to a voltage representative of a digital LO signal;

said first reference driver and said signal drivers electrically interconnected to said ground point on said integrated circuit block, said ground point interconnected through an impedance on said integrated circuit block to a system ground connection for said integrated circuit, so that current flowing from and to said system ground connection through said ground point to said signal drivers and said first reference driver flows through said impedance.

2. The transmitter block of claim 1, wherein said impedance is attributable to a package impedance of said integrated circuit.

3. The transmitter block of claim 1, wherein
   said signal drivers and said first reference driver are adapted for interconnection to a clock source;
   said signal drivers are adapted to be driven to produce outputs representative of inputs at transitions of said clock source; and
   wherein said impedance produces identical noise signals relative to said system ground connection at said signal driver outputs and said first reference output as a result of currents flowing at said transitions.

4. The transmitter block of claim 1, further comprising
   a second reference driver, for generating at a second reference output, the other one of
   a. an output voltage that when measured relative to said ground point, corresponds to a voltage representative of a digital HI signal; and
   b. an output voltage that when measured relative to said ground point corresponds to a voltage representative of a digital LO signal;

said second reference driver interconnected to said ground point on said integrated circuit so that current flowing from and to said ground connection through said ground point to said second reference driver also flows through said impedance.

5. The transmitter block of claim 3, wherein said second reference driver is adapted for interconnection to said clock source, and wherein said impedance produces noise signals at said second reference output identical to noise signals at said first reference output, as a result of currents flowing at said transitions.

6. The transmitter block of claim 4, wherein said plurality of signal drivers comprises less than sixteen signal drivers, geometrically proximate on said integrated circuit.

7. The transmitter block of claim 4, wherein said plurality of signal drivers comprises less than eight signal drivers, geometrically proximate on said integrated circuit.

8. A digital signal receiver block having receiver block outputs for generating digital HI and LO signals, said block comprising:

a plurality of comparators, each having
      a signal input for receiving a voltage signal representative of one of a digital HI signal and LO signal and a noise signal;
      an output interconnected with one of said receiver block outputs;
      a first reference input for receiving a reference voltage signal including a signal indicative of a digital HI signal, and a noise signal;

wherein said first reference inputs of said plurality of comparators are interconnected so that each of said first reference inputs receives the same reference voltage signal;

each said comparator adapted to produce at its output a signal representative of a digital HI signal when a voltage at its signal input exceeds a threshold voltage derived from a reference voltage at its first reference input.

9. The receiver block of claim 8, wherein said threshold voltage equals a reference voltage at its first reference input less a voltage representative of a noise margin.

10. The receiver block of claim 9, further comprising clock input:
    a latch interconnected with said clock input and between each output of said plurality of comparators and said receiver block outputs, said latch adapted to latch said comparator outputs upon a transition at said clock input.

11. The receiver block of claim 8, wherein each of said comparators further comprises
    a second reference input for receiving a reference voltage signal including a signal indicative of a high threshold voltage of a signal representative of a digital LO signal, and a noise signal;
    wherein said second reference inputs of said plurality of comparators are interconnected so that each of said second reference inputs receives the same reference voltage signal; and
    each of said comparators is adapted to produce at its output a signal representative of a digital LO signal when a voltage at its signal input is less than a threshold voltage derived from a reference voltage at its second reference input.

12. A digital signal receiver block having receiver block outputs for generating digital HI and LO signals, said block comprising:

a plurality of comparators, each having
a signal input for receiving a voltage signal representative of one of a digital HI signal and LO signal and a noise signal;
an output interconnected with one of said receiver block outputs,
a first reference input for receiving a reference voltage signal including a signal indicative of a digital LO signal, and a noise signal;
wherein said first reference inputs of said plurality of comparators are interconnected so that each of said reference inputs receives the same reference voltage signal; and
each of said comparators is adapted to produce at its output a signal representative of a digital LO signal when a voltage at its signal input is less than a threshold voltage derived from a reference voltage at its first reference input.

13. The receiver block of claim 12, further comprising
a clock input;
a latch interconnected with said clock input and between each output of said plurality of comparators and said receiver block outputs, said latch adapted to latch said comparator outputs upon a transition at said clock output.

14. The receiver block of claim 13, wherein each of said comparators further comprises
a second reference input for receiving a reference voltage signal including a signal indicative of a digital HI signal, and a noise signal;
wherein said second reference inputs of said plurality of comparators are interconnected so that each of said second reference inputs receives the same reference voltage signal; and
each of said comparators is adapted to produce at its output a signal representative of a digital HI signal when a voltage at its signal input exceeds a threshold voltage derived from a reference voltage at its second reference input.

15. The receiver block of claim 14, wherein each of said comparators is adapted to produce an error signal when a voltage at said signal input of said comparator is less than said threshold voltage derived from a reference voltage at its second reference input and exceeds said threshold voltage derived from a reference voltage at its first reference input.

16. The receiver block of claim 15, wherein said threshold voltage equals a reference voltage at said first reference input plus a determined noise margin voltage.

17. A method of transmitting and receiving a plurality of signals representative of digital HI and LO signals from a transmitter to a receiver comprising the steps of
a. concurrently transmitting said plurality of signals, each having a voltage level representative of one of a digital HI and LO signal and a noise signal from a transmitter to a receiver;
b. transmitting a reference signal comprised of a signal having a voltage level representative of a HI signal and a noise signal to said receiver;
c. receiving said plurality of signals and said reference signal at said receiver;
d. comparing said reference signal to each of said plurality of signals;
e. outputting a signal representative of a digital HI signal at said receiver, for each of said plurality of signals that exceeds a threshold voltage derived from said reference signal.

18. The method of claim 17, wherein steps to a. to d. are synchronized by a clock signal at said transmitter and said receiver.

19. A signal transmitter block for transmitting digital signals to a receiver, said block comprising:
means for transmitting a plurality of output signals, each output signal comprised of a voltage signal representative of digital HI and LO signals and noise;
means for transmitting a reference signal, representative of said noise and a determined one of
a. a signal having a voltage level representative of a digital HI signal; and
b. a signal having a voltage level representative of a digital LO signal
wherein said means for transmitting said plurality of output signals and said means for transmitting a reference signal are interconnected to accept a common clock, so that outputs of said means for transmitting said plurality of output signals and said means for transmitting a reference signal are generated upon transitions of said clock.

20. A receiver comprising:
means to concurrently receive a plurality of received signals each received signal comprised of a voltage signal representative of digital HI and LO signals and noise;
means to receive a reference signal representative of said noise and a determined one of
a. a signal having a voltage level representative of a digital HI signal; and
b. a signal having a voltage level representative of a digital LO signal
means to separately compare each of said plurality of received signals to said reference signal to determine whether each of said plurality of signals comprises a voltage signal representative of a digital HI signal, or a voltage signal representative of a digital LO signal.

21. In combination, a signal transmitter block formed as part of an integrated circuit, said transmitter block for transmitting digital signals to a receiver, said block comprising:
a plurality of signal drivers, each for generating output voltages at a signal driver output, that when measured relative to a ground point on said integrated circuit are representative of digital HI and LO signals;
a first reference driver, for generating at a first reference output, an output voltage that when measured relative to said ground point corresponds to a voltage representative of a digital LO signal;
said first reference driver and said signal drivers electrically interconnected to said ground point on said integrated circuit block,
said ground point interconnected through an impedance on said integrated circuit block to a system ground connection for said integrated circuited, so that current flowing from and to said ground connection through said ground point to any and all of said signal drivers and said first reference driver flows through said impedance;
a digital signal receiver block having receiver block outputs for generating digital HI and LO signals, said block comprising:

a plurality of comparators, each having
a signal input interconnected with one of said signal drivers outputs for receiving a voltage signal representative of one of a digital HI signal and LO signal and a noise signal;
an output interconnected with one of said receiver block outputs,
a first reference input interconnected with said first reference driver for receiving a reference voltage signal including a signal indicative of a digital LO signal, and a noise signal;
wherein said first reference inputs of said plurality of comparators are interconnected so that each of said first reference inputs receives the same reference voltage signal; and
each of said comparators is adapted to produce at its output a signal representative of a digital LO signal when a voltage at its signal input is less than a threshold voltage derived from said reference voltage at its first reference input.

22. A signal transmitter formed as part of an integrated circuit, said transmitter for transmitting digital signals to a receiver, said transmitter and said receiver interconnected with a system ground, said transmitter comprising:
a plurality of signal drivers, each for generating output voltages at a signal driver output, that when measured relative to a ground point on said integrated circuit are representative of digital HI and LO signals;
a first reference driver, for generating at a first reference output, an output voltage that when measured relative to said ground point, corresponds to a voltage representative of a digital LO signal and that when measured relative to said system ground comprises a noise signal indicative of a noise component in signals representative of digital LO signals.

23. A signal transmitter formed as part of an integrated circuit, said transmitter for transmitting digital signals to a receiver, said transmitter and said receiver interconnected with a system ground, said transmitter comprising:
a plurality of signal drivers, each for generating output voltages at a signal driver output, that when measured relative to a ground point on said integrated circuit are representative of digital HI and LO signals;
a first reference driver, for generating at a first reference output, an output voltage that when measured relative to said ground point, corresponds to a voltage representative of a digital HI signal and that when measured relative to said system ground comprises a noise signal indicative of a noise component in signals representative of digital HI signals.

24. In combination, a signal transmitter block for transmitting digital signals to a receiver, said block comprising:
a plurality of signal drivers, each for generating output voltages at a signal driver output, that when measured relative to a ground point on said integrated circuit are representative of digital HI and LO signals;
a first reference driver, for generating at a first reference output, an output voltage that when measured relative to said ground point corresponds to a voltage representative of a digital LO signal;
a digital signal receiver block having receiver block outputs for generating digital HI and LO signals, said block comprising:
a plurality of comparators, each having
a signal input interconnected with one of said signal drivers outputs for receiving a voltage signal representative of one of a digital HI signal and LO signal and a noise signal;
an output interconnected with one of said receiver block outputs,
a first reference input interconnected with said first reference driver for receiving a reference voltage signal including a signal indicative of a digital LO signal, and a noise signal;
wherein said first reference inputs of said plurality of comparators are interconnected so that each of said first reference inputs receives the same reference voltage signal; and
each of said comparators is adapted to produce at its output a signal representative of a digital LO signal when a voltage at its signal input is less than a threshold voltage derived from said reference voltage at its first reference input.

25. A signal transmitter block formed as part of an integrated circuit for transmitting digital signals to a receiver, said block comprising
a plurality of signal drivers for generating output voltages representative of digital HI and LO signals;
a reference driver for generating at a first reference output, a determined one of:
a) an output voltage representative of a digital HI signal;
b) an output voltage representative of a digital LO signal;
wherein said plurality of signal drivers and said first reference driver are adapted for interconnection to a common clock source such that said signal drivers and said reference driver generate said output voltages at transitions of said clock source.

26. The transmitter block of claim 25, wherein said output voltages are measured relative to a ground point on said integrated circuit.

27. The transmitter block of claim 26, wherein said first reference driver and said signal drivers are electrically connected to said ground point on said integrated circuit and said ground point is interconnected through an impedance to a system ground connection for said integrated circuit, so that current flows between said system ground connection and said signal drivers via said ground point.

28. The transmitter block of claim 27 wherein current provided to said reference driver flows through said impedance.

29. A digital signal receiver block having receiver block outputs for generating digital HI and LO signals, said block comprising:
a plurality of comparators, each having:
a signal input for receiving a voltage signal representative of a digital HI or digital LO signal and a noise signal;
a first reference input for receiving a reference voltage;
a clock input; and
a latch interconnected with said clock input and each output of said plurality of comparators;
wherein said latch is adapted to latch said outputs upon a transition of said clock input.

30. The digital signal receiver block of claim 29 wherein said first reference inputs of said plurality of comparators are interconnected to receive the same reference voltage.

31. The digital signal receiver block of claim 29 wherein each of said plurality of comparators is adapted to produce at its output a signal representative of a digital HI signal when a voltage at its signal input exceeds a threshold voltage derived from a reference voltage at its first reference input.

32. The digital signal receiver block of claim 29 wherein each of said plurality of comparators is adapted to produce at its output a signal representative of a digital LO signal when a voltage signal at its signal input is less than a threshold voltage derived from a reference voltage at its first reference input.

* * * * *